United States Patent
Shimizu et al.

(10) Patent No.: US 8,108,629 B2
(45) Date of Patent: Jan. 31, 2012

(54) METHOD AND COMPUTER FOR REDUCING POWER CONSUMPTION OF A MEMORY

(75) Inventors: Masaaki Shimizu, Mitaka (JP); Naonobu Sukegawa, Inagi (JP)

(73) Assignee: Hitachi, Ltd., Tokyo (JP)

( * ) Notice: Subject to any disclaimer, the term of this patent is extended or adjusted under 35 U.S.C. 154(b) by 750 days.

(21) Appl. No.: 11/707,114

(22) Filed: Feb. 16, 2007

(65) Prior Publication Data

US 2008/0034234 A1   Feb. 7, 2008

(30) Foreign Application Priority Data

Aug. 2, 2006   (JP) .................. 2006-211143

(51) Int. Cl.
  *G06F 12/00*   (2006.01)
  *G06F 13/00*   (2006.01)
  *G06F 13/28*   (2006.01)
(52) U.S. Cl. .............................. 711/154; 711/5; 365/226
(58) Field of Classification Search .................... 711/154
  See application file for complete search history.

(56) References Cited

U.S. PATENT DOCUMENTS

| | | | |
|---|---|---|---|
| 5,457,790 A | 10/1995 | Iwamura et al. | |
| 5,734,913 A | 3/1998 | Iwamura et al. | |
| 5,928,365 A | 7/1999 | Yoshida | |
| 6,088,808 A | 7/2000 | Iwamura et al. | |
| 6,215,714 B1 | 4/2001 | Takemae et al. | |
| 6,671,815 B2 | 12/2003 | Iwamura et al. | |
| 6,954,837 B2 | 10/2005 | Woo et al. | |
| 7,010,656 B2 * | 3/2006 | Gupta | 711/165 |
| 7,272,734 B2 * | 9/2007 | Gooding | 713/320 |
| 2002/0099963 A1 | 7/2002 | Iwamura et al. | |
| 2004/0193829 A1 * | 9/2004 | Woo et al. | 711/170 |
| 2006/0117160 A1 * | 6/2006 | Jackson et al. | 711/170 |

FOREIGN PATENT DOCUMENTS

| | | |
|---|---|---|
| JP | 7-160574 | 12/1993 |
| JP | 09-212416 | 11/1996 |
| JP | 2005-235203 | 2/2005 |

* cited by examiner

*Primary Examiner* — Brian Peugh
*Assistant Examiner* — Prasith Thammavong
(74) *Attorney, Agent, or Firm* — Stites & Harbison PLLC; Juan Carlos A. Marquez, Esq.

(57) ABSTRACT

Provided is a method of managing, in a computer including a processor and a memory that stores information referred to by the processor, the memory. The memory includes a plurality of memory banks, respective power supplies of which are independently controlled. The respective memory banks include a plurality of physical pages. The method includes collecting the physical pages having same degrees of use frequencies in the same memory bank, selecting the memory bank, the power supply for which is controlled, on the basis of the use frequency, and controlling the power supply for the memory bank selected.

13 Claims, 13 Drawing Sheets

DETERMINE NUMBER OF MEMORY BANKS TO BE SET IN LOW POWER CONSUMPTION MODE FROM TARGET POWER SUPPLY VALUE

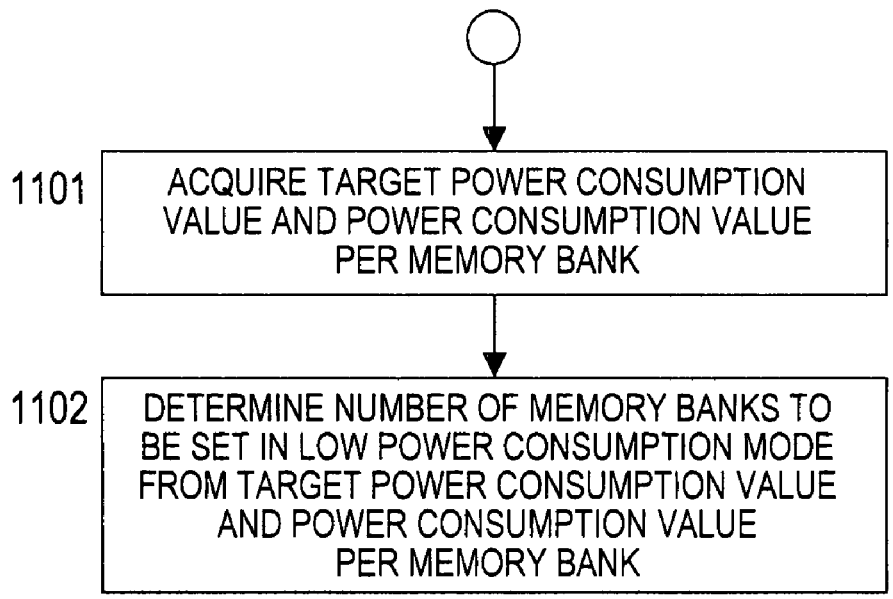

1101 ACQUIRE TARGET POWER CONSUMPTION VALUE AND POWER CONSUMPTION VALUE PER MEMORY BANK

1102 DETERMINE NUMBER OF MEMORY BANKS TO BE SET IN LOW POWER CONSUMPTION MODE FROM TARGET POWER CONSUMPTION VALUE AND POWER CONSUMPTION VALUE PER MEMORY BANK

*FIG. 11*

TARGET POWER CONSUMPTION VALUE

| TARGET POWER CONSUMPTION VALUE OF ENTIRE MEMORY | 10W |

*FIG. 12*

POWER-CONSUMPTION-PER-BANK TABLE 1300

| | NORMAL MODE | LOW POWER CONSUMPTION MODE |
|---|---|---|
| POWER CONSUMPTION PER ONE BANK | 1300mW | 100mW |

*FIG. 13*

| TARGET VALUE OF NUMBER OF BANKS IN LOW POWER CONSUMPTION MODE | 5 |
|---|---|

*FIG. 14*

| USE FREQUENCY THRESHOLD | 200 |

POWER-MODE-TRANSITION TIME TABLE 1700

| TRANSITION PATTERN | NORMAL MODE TO LOW POWER CONSUMPTION MODE | LOW POWER CONSUMPTION MODE TO NORMAL MODE |
|---|---|---|
| TRANSITION TIME | 5ns | 1 μs |

METHOD AND COMPUTER FOR REDUCING POWER CONSUMPTION OF A MEMORY

CLAIM OF PRIORITY

The present application claims priority from Japanese application JP2006-211143 filed on Aug. 2, 2006, the content of which is hereby incorporated by reference into this application.

BACKGROUND OF THE INVENTION

1. Field of the Invention

This invention relates to a method of managing a memory used in a computer, and more particularly, to a method of reducing power consumption of a memory.

2. Related Background Art

With the recent improvement of performance of computer systems, power consumption of the computer systems is on the increase. In particular, a petaflops-class computer in the future has a significant problem with the scale of power consumption of a computer system. In general, in a computer system, power consumption of CPUs, power consumption of memories, and power consumption of other sections are considered to be substantially equal. In order to reduce power consumption of the computer system, dynamic power control for the CPUs is actively performed. However, reduction of power consumption of the memories is rarely examined.

It is possible to set a DRAM used as a main memory for a computer in a low power consumption mode (e.g., a self refresh mode) when there is no memory access. Power consumption of the DRAM set in the low power consumption mode is much lower than that in the normal standby mode. Therefore, it is possible to reduce power consumption of the memories and finally reduce power consumption of the computer system by controlling a power supply mode of the DRAM.

In order to reduce power consumption of the memories, for example, U.S. Pat. No. 6,954,837 discloses a technique for gathering used areas of memories in an arbitrary memory device and setting a memory device not in use in a low power consumption mode.

U.S. Pat. No. 6,215,714 discloses a device that holds data by periodically refreshing only a memory bank that has data.

JP 09-212416 A discloses a technique that includes means for judging whether an entire memory bank is an unused space and memory power saving means and is used for cutting power supply to the memory bank, the entire space of which is an unused space.

On the other hand, in order to reduce power consumption of a processor, for example, JP 2005-235203 A discloses a technique for detecting a command for operating an arithmetic circuit in advance and activating the arithmetic circuit corresponding to the command in advance. After an arithmetic operation is finished, the arithmetic circuit used is inactivated. According to this technique, it is possible to realize reduction in power consumption of a computer system by using a low power consumption mode while controlling latency.

SUMMARY OF THE INVENTION

According to the conventional techniques, such allocation as to reduce power consumption is executed at a point when a memory is allocated. However, control corresponding to an actual state of use of the memory allocated is not disclosed. Therefore, according to the conventional techniques, when the allocation of the memory and the actual state of use are different in amount, it is impossible to effectively reduce power consumption of the memory. For example, after a large capacity memory is allocated to a certain program, when only a part of the memory allocated is used, it is impossible to reduce power consumption of other parts of the memory that are allocated but are not used.

According to a representative invention disclosed in this application, there is provided a method of managing a memory included in a computer, wherein: the computer further includes a processor; the memory stores information referred to by the processor; the memory includes a plurality of memory banks, respective power supplies of which are independently controlled; the respective memory banks includes a plurality of physical pages, the method comprising: collecting the physical pages having same degrees of use frequencies in the same memory bank; selecting the memory bank, the power supply for which is controlled, on the basis of the use frequencies; and controlling the power supply for the selected memory bank.

According to an embodiment of this invention, it is possible to effectively reduce power consumption of memories in a computer system according to an actual state of use thereof.

BRIEF DESCRIPTION OF THE DRAWINGS

FIG. 11 is a flowchart of processing executed by the memory-bank-power-supply judging module according to the first embodiment of this invention in order to determine the number of the memory banks that should be set in the low power consumption mode.

FIG. 12 is a diagram for explaining the target power consumption value referred to by the memory-bank-power-supply judging module according to the first embodiment of this invention.

FIG. 13 is a diagram for explaining a power-consumption-per-bank table according to the first embodiment of this invention.

FIG. 14 is a diagram for explaining a target value of the number of low power consumption mode banks referred to by the memory-bank-power-supply judging module according to the first embodiment of this invention.

DETAILED DESCRIPTION OF THE PREFERRED EMBODIMENTS

Embodiments of this invention will be hereinafter explained with reference to the accompanying drawings.

Figure 1:
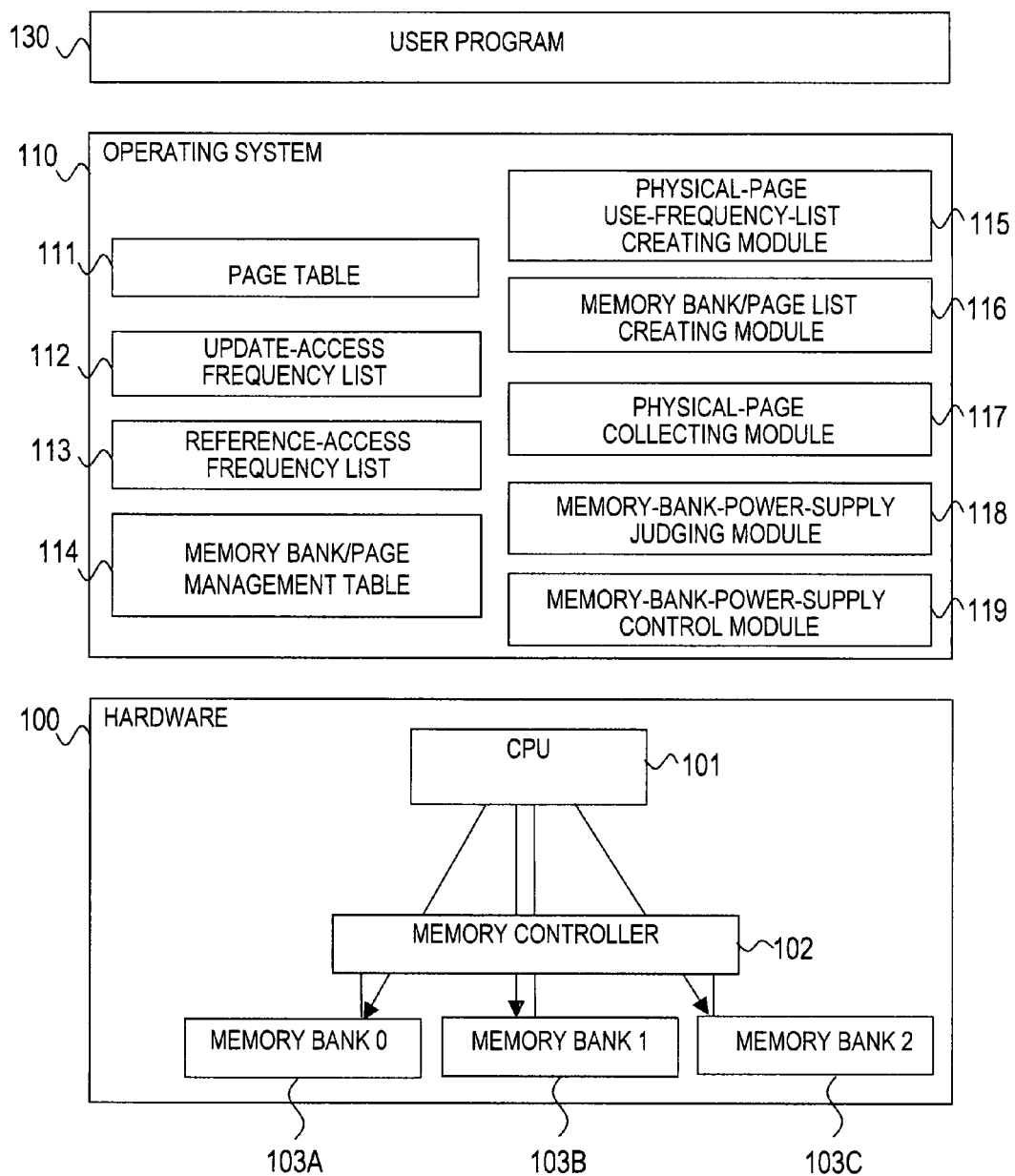
FIG. 1 is a block diagram for explaining a structure of a computer according to a first embodiment of this invention.

FIG. 1 is a block diagram for explaining a structure of a computer according to a first embodiment of this invention.

The computer according to this embodiment includes hardware 100, an operating system (OS) 110, and a user program 130.

The hardware 100 includes a CPU 101, a memory controller 102, and memory banks 103A to 103C.

The respective memory banks 103A to 103C are units of management of a memory included in the computer. Power supplies for the respective memory banks 103A to 103C are independently controlled. Information referred to by the CPU 101 is stored in the respective memory banks 103A to 103C. In the following explanation, when it is unnecessary to distinguish the respective memory banks 103A to 103C from one another, the memory banks are simply described as the memory banks 103.

The respective memory banks 103 may be constituted by, for example, one or a plurality of dynamic random access memory (DRAM) devices. Three memory banks 103 are shown in FIG. 1. However, the hardware 100 according to this embodiment can include an arbitrary number of memory banks 103.

Bank numbers for identifying the respective memory banks 103 are given to the respective memory banks 103. In the example of FIG. 1, bank numbers given to the memory banks 103A, 103B, and 103C are "0", "1", and "2", respectively.

Physical storage areas in the respective memory banks 103 are divided into physical pages of a predetermined size (e.g., 4 kilobytes). The physical pages are units of management of the physical storage areas in the respective memory banks 103.

The memory controller 102 controls the memory banks 103 according to an instruction from the CPU 101. The memory controller 102 according to this embodiment controls at least the power supplies for the respective memory banks 103.

The CPU 101 is a processor that executes software stored in the memory banks 103.

The OS 110 is software stored in the memory banks 103 and executed by the CPU 101. The OS 110 according to this embodiment includes a page table 111, an update-access frequency list 112, a reference-access frequency list 113, a memory bank/page management table 114, a physical-page use-frequency-list creating module 115, a memory bank/page list creating module 116, a physical-page collecting module 117, a memory-bank-power-supply judging module 118, and a memory-bank-power-supply control module 119.

The page table 111 is a mapping table that associates a virtual address space provided to a process executed by the CPU 101 and physical address spaces of the memory banks 103. The virtual address space is managed in a unit of virtual page having the same size as physical pages. The page table 111 further includes a reference bit (not shown) indicating whether each physical page is referred to and an update bit (not shown) indicating whether each physical page is updated.

The update-access frequency list 112, the reference-access frequency list 113, and the memory bank/page management table 114 will be explained in detail later.

The physical-page use-frequency-list creating module 115, the memory bank/page list creating module 116, the physical page collecting module 117, the memory-bank-power-supply judging module 118, and the memory-bank-power-supply control module 119 are program modules constituting the OS 110. Processing executed by the respective modules will be explained in detail. The processing executed by the respective modules in the following explanation is actually executed by the CPU 101.

The user program 130 is software executed by the CPU 101 on the OS 110. The user program 130 may be an arbitrary application program.

Figure 2:
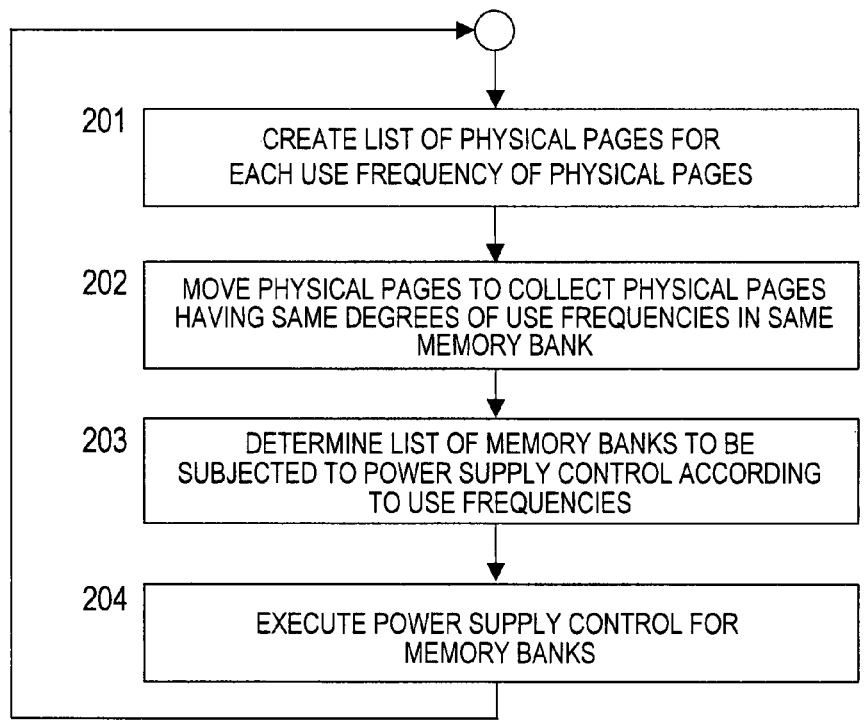
FIG. 2 is a flowchart of entire processing executed for controlling the power supplies for the memory banks in the first embodiment of this invention.

FIG. 2 is a flowchart of entire processing executed for controlling the power supplies for the memory banks 103 in the first embodiment of this invention.

The processing shown in FIG. 2 may be executed at arbitrary timing. For example, the processing shown in FIG. 2 is periodically executed.

First, the physical-page use-frequency-list creating module 115 creates an update-access frequency list 112 and a reference-access frequency list 113 (201). Details of processing executed in Step 201 will be explained later with reference to FIG. 3. The lists created in Step 201 will be explained later with reference to FIG. 4.

Next, the physical-page collecting module 117 moves or replaces the physical pages in order to collect physical pages having same degrees of use frequencies in the same memory bank 103 (202). Details of processing executed in Step 202 will be explained later with reference to FIG. 7.

The memory-bank-power-supply judging module 118 determines, according to a use frequency, the memory bank 103 to be subjected to power supply control (203). Details of processing executed in Step 203 will be explained later with reference to FIG. 10.

The memory-bank-power-supply control module 119 executes power supply control for the memory bank determined as an object of power supply control in Step 203 (204). Details of processing executed in Step 204 will be explained later with reference to FIGS. 8 and 9.

Figure 3:
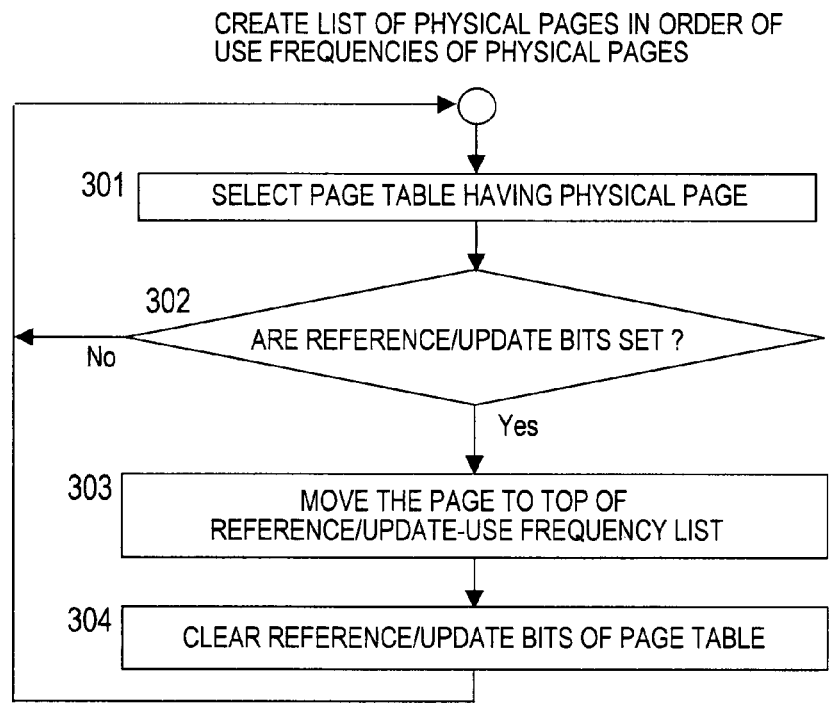
FIG. 3 is a flowchart of processing executed by the physical-page use-frequency-list creating module according to the first embodiment of this invention.

FIG. 3 is a flowchart of processing executed by the physical-page use-frequency-list creating module 115 according to the first embodiment of this invention.

Processing shown in FIG. 3 is executed in Step 201 of FIG. 2.

First, the physical-page use-frequency-list creating module 115 selects a page table including a physical page (i.e., a page table including a virtual page to which a physical page is allocated) (301).

Next, the physical-page use-frequency-list creating module 115 judges whether the physical page is referred to or updated with reference to a reference bit and an update bit of the page table selected (302). When the physical page is neither referred to nor updated, the judgment results in "No" in Step 302. In this case, since it is unnecessary to update any of the update-access frequency list 112 and the reference-access frequency list 113, the processing returns to Step 301.

On the other hand, when the physical page is referred to or updated, the judgment results in "Yes" in Step 302. In this case, the physical-page use-frequency-list crating module 115 updates the update-access frequency list 112 or the reference-access frequency list 113 (303).

Specifically, when the physical page is referred to, the physical-page use-frequency-list creating module 115 moves a physical-page management entry, which corresponds to the physical page referred to, to the top of the reference-access frequency list 113. The physical-page management entry will be explained later with reference to FIG. 4. When the physical page is updated, the physical-page use-frequency-list creating module 115 moves a physical-page management entry, which corresponds to the physical page updated, to the top of the update-access frequency list 112.

The physical-page use-frequency-list creating module 115 clears the reference bit and the update bit of the page table selected in Step 301 (304). The judgment for the physical page, the reference bit and update bit of which are cleared, results in "No" in Step 302 unless the physical page is referred to or updated once or more.

Thereafter, the processing returns to Step 301.

Figure 4:
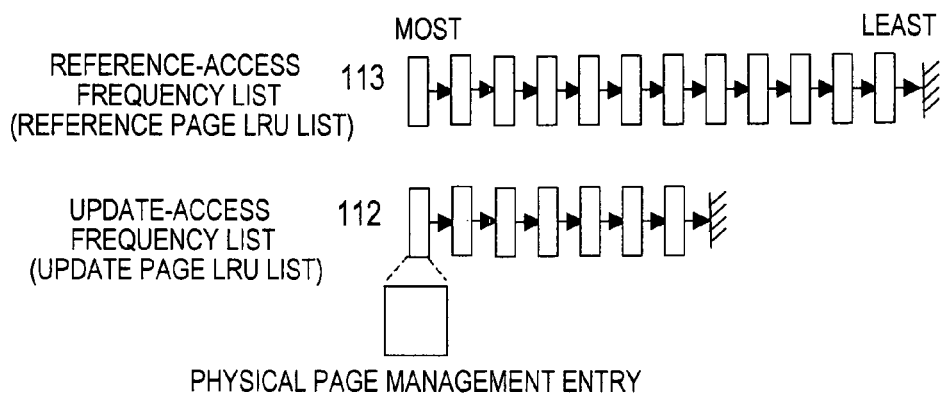
FIG. 4 is a diagram for explaining the physical-page use-frequency list according to the first embodiment of this invention.

FIG. 4 is a diagram for explaining the physical-page use-frequency list according to the first embodiment of this invention.

Specifically, the update-access frequency list 112 and the reference-access frequency list 113 are shown in FIG. 4.

The reference-access frequency list 113 is a Least Recently Used (LRU) list concerning reference to physical pages. Specifically, the reference-access frequency list 113 is an array of physical-page management entries. The respective physical-page management entries include at least identifiers of respective physical pages.

In an example of FIG. 4, a physical-page management entry at the left end represented as "most" is the top of the reference-access frequency list 113. A physical-page management entry at the right end represented as "least" is the end of the reference-access frequency list 113.

When it is judged in Step 302 of FIG. 3 that the physical page is referred to, a physical-page management entry corresponding to the physical page referred to (i.e., a physical-page management entry including an identifier of the physical page referred to) is moved to the top (i.e., the left end) of the reference-access frequency list 113 in Step 303. As a result, a physical-page management entry corresponding to a physical page referred to most recently is at the top of the reference-access frequency list 113. On the other hand, a physical-page management entry corresponding to a physical page referred to earliest is at the end of the reference-access frequency list 113.

In the following explanation, in this embodiment, as a physical-page management entry corresponding to a certain physical page is closer to the top of the reference-access frequency list 113 (in other words, the physical page is referred to later), it is judged that a use frequency (in this case, a reference frequency) of the physical page is higher.

As explained with reference to FIG. 6 later, an order of a physical-page management entry is used as an index indicating a use frequency of a physical page. An order of a physical-page management entry at the top of the reference-access frequency list 113 is "0". On the other hand, for example, when 10000 physical-page management entries are registered in the reference-access frequency list 113, an order of a physical-page management entry at the end is "9999".

The update-access frequency list 112 is an LRU list concerning update of physical pages. Specifically, the update-access frequency list 112 is an array of physical-page management entries as in the reference-access frequency list 113.

When it is judged in Step 302 of FIG. 3 that the physical page is updated, a physical-page management entry corresponding to the updated physical page is moved to the top (the left end) of the update-access frequency list 112 in Step 303. As a result, a physical-page management entry corresponding to a physical page having a highest use frequency (in this case, update frequency) is at the top of the update-access frequency list 112 as in the reference-access frequency list 113. In other words, it is judged that a physical page updated later has a higher update frequency. As in the reference-access frequency list 113, orders are given to physical-page management entries of the update-access frequency list 112.

In the following explanation, in this embodiment, a use frequency of a physical page is judged on the basis of at least one of a reference frequency and an update frequency of the physical page.

In the example of FIG. 4, a use frequency by update access and a use frequency by reference access are distinguished from each other and managed. However, an access use-frequency list (not shown) for managing the use frequency by access without distinguishing update and reference from each other may be created. In that case, a use frequency of a physical page may be judged on the basis of the use frequency by access.

In the examples of FIGS. 3 and 4, the update-access frequency list 112 and the reference-access frequency list 113 are created on the basis of the update bit and the reference bit of the page table. However, the update-access frequency list 112 and the reference-access frequency list 113 may be created according to different methods.

For example, when there is a physical page not used in any process, the physical page not used may be preferentially arranged in low orders in the update-access frequency list 112 and the reference-access frequency list 113. As a result, it is judged that a use frequency of the physical page not used in any process is lower than a use frequency of a page used for some process.

Alternatively, when there is a physical page used as a file cache, the physical page may be arranged in low orders in the update-access frequency list 112 and the reference-access frequency list 113. As a result, it is judged that a use frequency of the physical page used as the file cache is lower than a use frequency of a physical page not used as a file cache.

Figure 5:
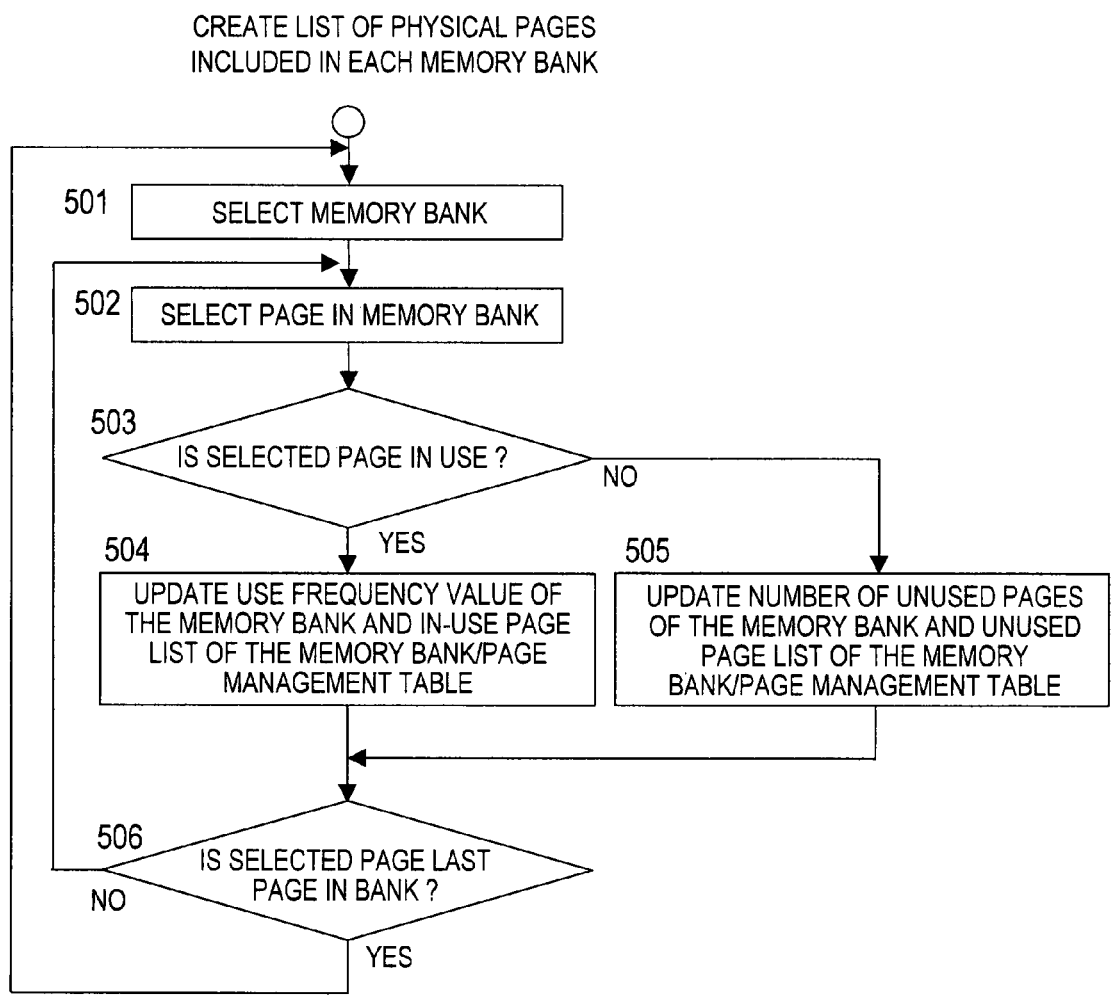
FIG. 5 is a flowchart of processing executed by the memory bank/page list creating module according to the first embodiment of this invention.

FIG. 5 is a flowchart of processing executed by the memory bank/page list creating module 116 according to the first embodiment of this invention.

Figure 6:
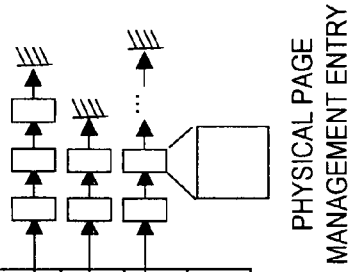
FIG. 6 is a diagram for explaining the memory bank/page management table according to the first embodiment of this invention.

The processing shown in FIG. 5 is executed to update the memory bank/page management table 114 shown in FIG. 6 when the update-access frequency list 112 or the reference-access frequency list 113 is updated in Step 201 of FIG. 2 (i.e., the processing shown in FIG. 3).

First, the memory bank/page list creating module 116 selects any one of the memory banks 103 (501). For example, the memory bank/page list creating module 116 may sequentially select the memory banks 103A to 103C included in the computer system.

Next, the memory bank/page list creating module 116 selects any one of the physical pages included in the memory bank 103 selected (502). For example, the memory bank/page list creating module 116 may sequentially select the physical pages included in the memory bank 103 from the one at the top.

The memory bank/page list creating module 116 judges whether the physical page selected is in use (i.e., currently used) (503). The memory bank/page list creating module 116 executes the judgment in Step 503 by referring to a flag (not shown) indicating whether the physical page is used by the OS 110 in the page table.

When it is judged in Step 503 that the physical page selected is in use, the memory bank/page list creating module 116 updates values 603 to 605 concerning a use frequency and an in-use page list 608 in the memory bank/page management table 114 (504).

When it is judged in Step 503 that the physical page selected is not in use, the memory bank/page list creating module 116 updates a number of unused pages 606 concerning a use frequency and an unused page list 608 in the memory bank/page management table 114 (505).

The update in Steps 504 and 505 will be explained later with reference to FIG. 6.

The memory bank/page list creating module 116 judges, after executing Steps 504 and 505, whether the physical page selected in Step 502 is the last physical page in the memory bank 103 selected in Step 501 (506).

When it is judged in Step 506 that the physical page selected is the last physical page in the memory bank 103, the update of the memory bank/page update table 114 is finished for all the physical pages included in the memory bank 103 selected in Step 501. In this case, in order to update the memory bank/page update table 114 for the next memory bank 103, the processing returns to Step 501. In Step 501, the next memory bank 103 in the hardware 100 is selected. Thereafter, the processing in Step 502 and the subsequent steps is executed.

When it is judged in Step 506 that the physical page selected is not the last physical page in the memory bank 103, in order to update the memory bank/page management table 114 for the remaining physical pages, the processing returns to Step 502. In Step 502, the next physical page in the memory bank 103 is selected. Thereafter, the processing in Step 503 and the subsequent steps is executed.

FIG. 6 is a diagram for explaining the memory bank/page management table 114 according to the first embodiment of this invention.

The memory bank/page management table 114 according to this embodiment includes a bank number 601, a bank power supply 602, a use frequency average 603, a use frequency minimum value 604, a use frequency maximum value 605, the number of unused pages 606, an unused page list 607, and an in-use page list 608.

Bank numbers for identifying the respective memory banks 103 are registered in the bank number 601.

Values indicating states of the power supplies for the respective memory banks 103 are registered in the bank power supply 602. In an example of FIG. 6, a value of "ON" or "OFF" is registered as a value of the bank power supply 602. In this case, "ON" indicates a standby mode (i.e., a normal mode) and "OFF" indicates a low power consumption mode. The low power consumption mode of the memory banks 103 is, for example, a self-refresh mode or a power-down mode. In an example explained below, "OFF" indicates the self-refresh mode. However, in this embodiment, "OFF" may indicate the power-down mode or any other low power consumption mode as long as power consumption of the memory banks 103 decreases.

Values indicating use frequencies of the respective memory banks 103 are registered in the use frequency average 603, the use frequency minimum value 604, and the use frequency maximum value 605. These values are calculated on the basis of the order of the physical-page management entries registered in the update-access frequency list 112 or the reference-access frequency list 113.

These values may be calculated on the basis of only the update-access frequency list 112 or may be calculated on the basis of only the reference-access frequency list 113. Alternatively, both values calculated on the basis of the update-access frequency list 112 and values calculated on the basis of the reference-access frequency list 113 may be registered. Alternatively, these values may be calculated on the basis of the access use-frequency list (not shown) created without distinguishing update and reference from each other.

The use frequency average 603 is an average of the orders of the physical-page management entries corresponding to the physical pages included in the respective memory banks 103. The use frequency minimum value 604 is a minimum value of the orders of the physical-page management entries corresponding to the physical pages included in the respective memory banks 103. The use frequency maximum value 605 is a maximum value of the orders of the physical-page management entries corresponding to the physical pages included in the respective memory banks 103.

As explained with reference to FIG. 4, as a use frequency of a physical page is higher, an order of a physical-page management entry corresponding to the physical page is smaller. Therefore, when values registered in the use frequency average 603, the use frequency minimum value 604, and the use frequency maximum value 605 are small, this means that use frequencies corresponding to the values are high.

The number of unused pages 606 is the number of physical pages judged as "not used" in Step 503 of FIG. 5 among the physical pages included in the respective memory banks 103.

The unused page list 607 is a list of identifiers of the physical pages judged as "not used" in Step 503 of FIG. 5 among the physical pages included in the respective memory banks 103.

The in-use page list 608 is a list of identifiers of physical pages judged as "in use" in Step 503 of FIG. 5 among the physical pages included in the respective memory banks 103. This in-use page list 608 is an LRU list including physical-page management entries arrayed in an order of use frequencies as in FIG. 4. However, unlike FIG. 4, the in-use page list 608 is created for each of the memory banks 103.

In Step 504 of FIG. 5, a physical-page management entry corresponding to the physical page selected is added to the in-use page list 608 corresponding to the memory bank 103 including the physical page. Moreover, the use frequency average 603, the use frequency minimum value 604, and the use frequency maximum value 605 are updated on the basis of a use frequency of the physical page.

On the other hand, in Step 505 of FIG. 5, an identifier of the physical page corresponding to the physical page selected is added to the unused page list 607 corresponding to the memory bank 103 including the physical page. Moreover, a value of the number of unused pages 606 is incremented by 1.

Figure 7:
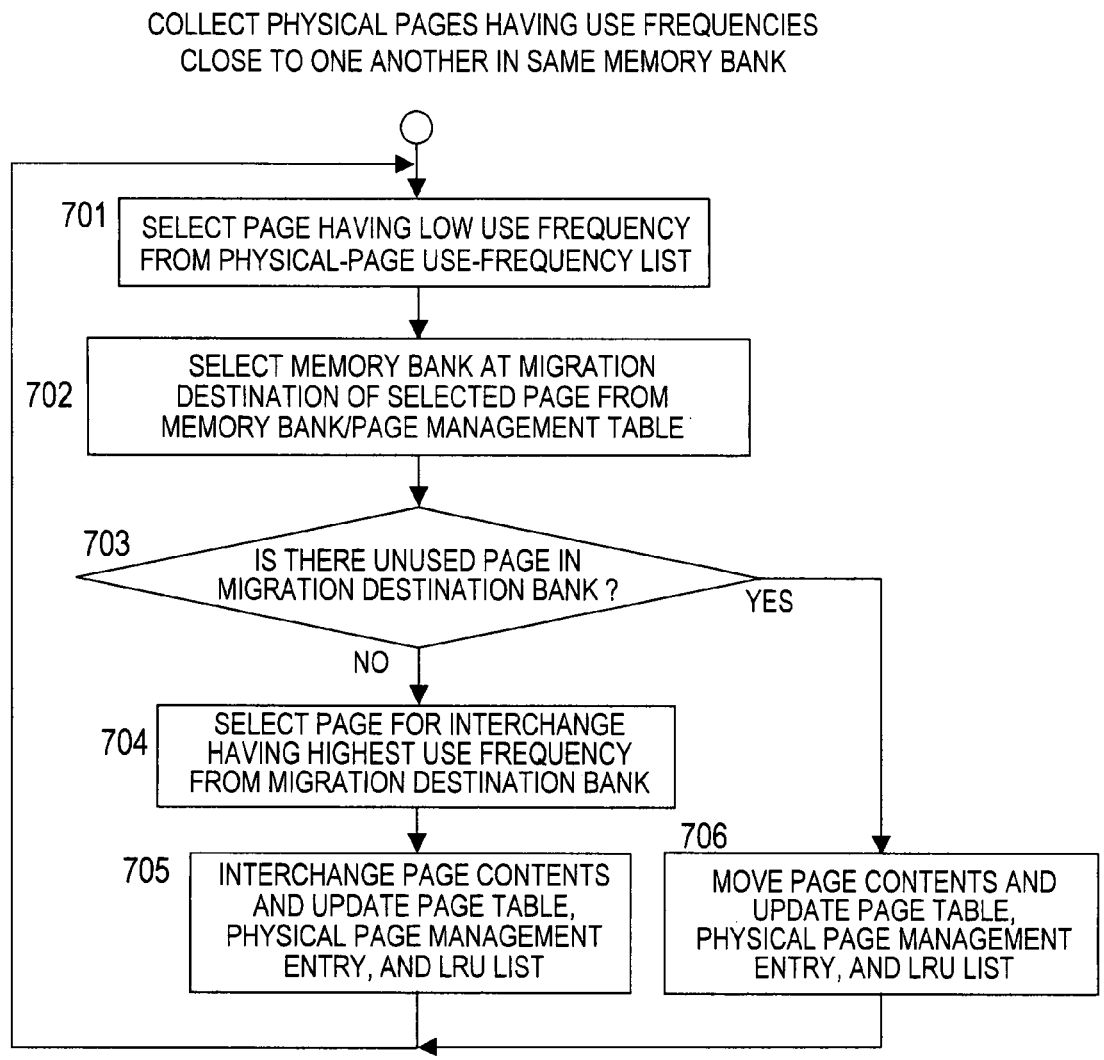
FIG. 7 is a flowchart of processing executed by the physical-page collecting module according to the first embodiment of this invention.

FIG. 7 is a flowchart of processing executed by the physical-page collecting module 117 according to the first embodiment of this invention.

The processing shown in FIG. 7 is executed in Step 202 of FIG. 2.

First, the physical-page collecting module 117 selects a page having a low use frequency with reference to the use frequency list of physical pages as shown in FIG. 4 (701). After execution of the processing shown in FIG. 7 is started, when Step 701 is executed for the first time, a physical page having a lowest use frequency (i.e., a physical page closest to the "least" side in FIG. 4) is selected.

In Step 701, only the update-access frequency list 112 may be referred to or only the reference-access frequency list 113 may be referred to. Alternatively, the access use-frequency list created without distinguishing update and reference from each other may be referred to.

Next, the physical-page collecting module 117 selects, with reference to the memory bank/page management table 114, the memory bank 103 that is a migration destination of the physical page selected in Step 701 (702). For example, the physical-page collecting module 117 may select the memory bank 103 having a lowest use frequency (i.e., the memory bank 103 having a largest use frequency average 603).

The physical-page collecting module 117 judges whether there is an unused physical page in the memory bank 103 selected as the migration destination (703).

When it is judged in Step 703 that there is an unused physical page, the physical-page collecting module 117 moves contents of the physical page selected in Step 701 to the unused physical page (706). As a result, a copy of the contents of the physical page selected in Step 701 is stored in the physical page in the memory bank 103 at the migration destination. Then, the contents of the physical page selected in Step 701 are deleted.

When the contents of the physical page are moved, it is necessary to update the page table, the physical-page management entry, the use frequency list of physical pages (FIG. 4), and the memory bank/page management table 114 (FIG. 6). Therefore, in Step 706, the physical-page collecting module 117 further updates these tables and the like.

According to the processing in Step 706, the physical pages are moved to the memory bank 103 having a lowest use frequency in an order from the physical page having a lowest use frequency.

On the other hand, when it is judged in Step 703 that there is no unused physical page, the physical-page collecting module 117 interchanges the contents of the physical page selected in Step 701 with contents of any one of the physical pages in the memory bank 103 at the migration destination. Therefore, the physical-page collecting module 117 selects a physical page to be interchanged from the physical pages in the memory bank 103 at the migration destination (704). Specifically, the physical-page collecting module 117 selects a physical page having a highest use frequency in the memory bank 103 at the migration destination (i.e., a physical page closest to the "most" side in FIG. 4).

When a use frequency of the physical page selected in Step 704 is lower than a use frequency of the physical page selected in Step 701, the processing by the physical-page collecting module 117 may return to Step 702 instead of proceeding to Step 705. In this case, the physical-page collecting module 117 may select the memory bank 103 having the lowest use frequency next to the memory bank 103 selected in Step 702 last time as a migration destination and may execute the processing in Step 703 and the subsequent steps again. When a use frequency of the memory bank 103 selected as a migration destination is equal to or higher than a use frequency of the memory bank 103 including the physical page selected in Step 701, the processing may return to Step 701 and select a physical page having the next lowest use frequency.

The physical-page collecting module 117 interchanges the contents of the physical page to be interchanged selected in Step 704 with the contents of the physical page selected in Step 701 (705). As a result, the contents stored in the physical page selected in Step 701 are stored anew in the physical page to be interchanged, and the contents stored in the physical page to be interchanged is stored anew in the physical page selected in Step 701.

Moreover, in Step 705, the physical-page collecting module 117 updates the page table, the physical-page management entry, the use frequency list of physical pages, and the memory bank/page management table 114 as in Step 706.

According to the processing in Steps 704 and 705, when a use frequency of the memory bank 103 selected as a migration destination is lower than a use frequency of the memory bank 103 including the physical page selected in Step 701 and when a use frequency of the physical page included in the memory bank 103 selected as the migration destination is higher than a use frequency of the physical page selected in Step 701, contents of the two physical pages are interchanged with each other.

Thereafter, the processing of the physical-page collecting module 117 returns to Step 701. The physical-page collecting module 117 selects a physical page having the lowest use frequency next to the physical page selected in Step 701 (701) and executes the processing in Step 702 and the subsequent steps.

As a result of the processing in FIG. 7, as shown in FIG. 6, physical pages having same degrees of use frequencies are collected in the same memory banks 103. In the example of FIG. 6, the memory bank 103 with the bank number 601 of "0" includes physical pages having use frequencies "0" to "149" (in other words, physical pages having relatively high use frequencies). The memory bank 103 with the bank number 601 of "1" includes physical pages having use frequencies "150" to "299" (in other words, physical pages having medium use frequencies). The memory bank 103 with the bank number 601 of "2" includes physical pages having use frequencies "300" to "600" (in other words, physical pages having relatively low use frequencies).

Figure 8:
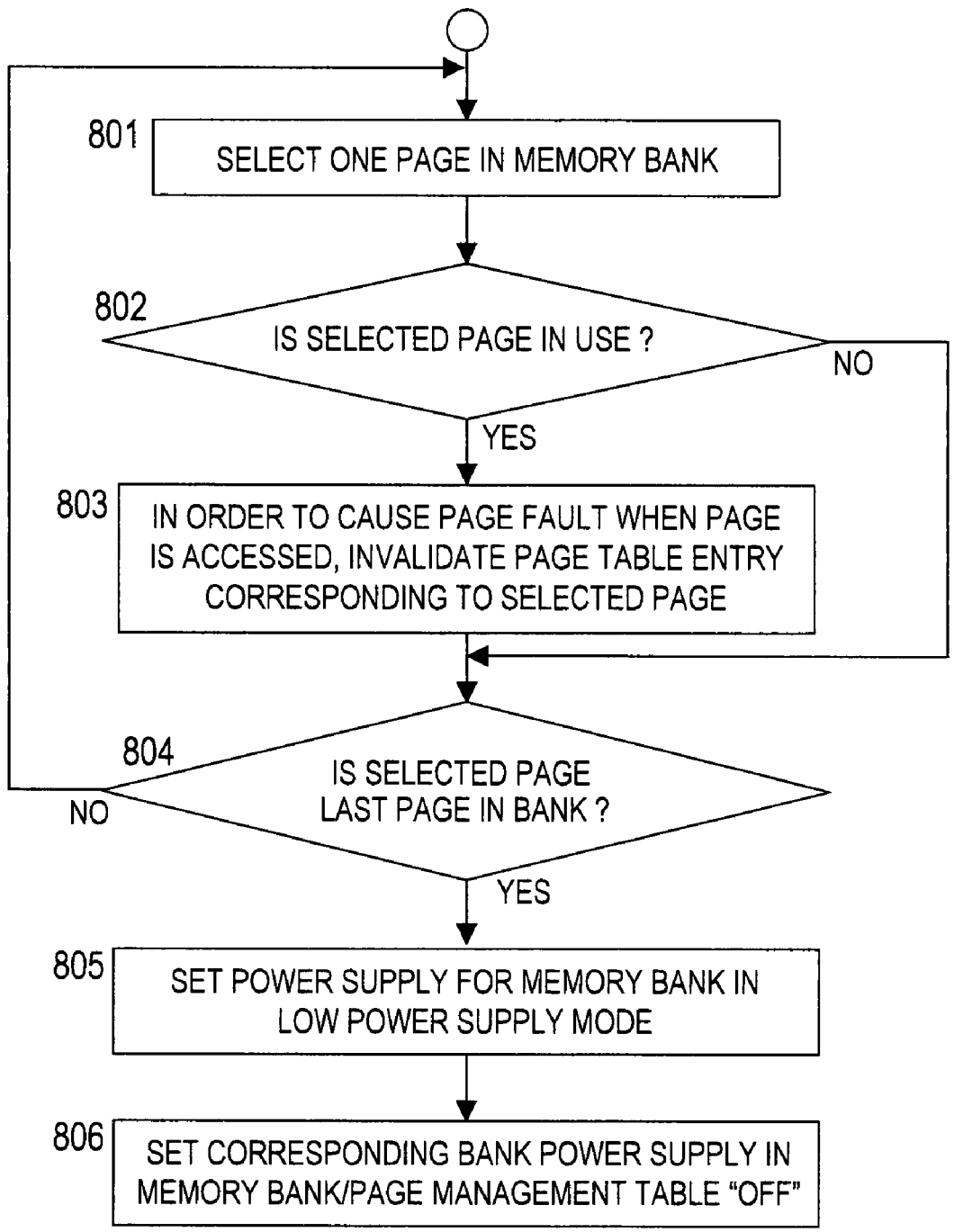
FIG. 8 is a flowchart of processing executed by the memory-bank-power-supply control module according to the first embodiment of this invention in order to set the power supplies for the memory banks in the low power consumption mode.

FIG. 8 is a flowchart of processing executed by the memory-bank-power-supply control module 119 according to the first embodiment of this invention in order to set the power supplies for the memory banks 103 in the low power consumption mode.

Specifically, the processing in FIG. 8 is executed in Step 204 of FIG. 2 in order to set the power supply for the memory bank 103 registered in a low-power-consumption candidate list (not shown) in the low power consumption mode. As explained later, the low-power-consumption candidate list is created by processing shown in FIG. 10 and the like in Step 203 of FIG. 2.

First, the memory-bank-power-supply control module 119 selects one physical page in the memory bank 103 registered in the low-power-consumption candidate list (801). After execution of the processing shown in FIG. 8 is started, when Step 801 is executed for the first time, for example, a physical page at the top in the memory bank 103 is selected.

Next, the memory-bank-power-supply control module 119 judges whether the physical page selected in Step 801 is currently used (802). This judgment may be executed according to the same method as Step 503 of FIG. 5.

When it is judged in Step 802 that the physical page is not currently used, it is unnecessary to invalidate a page table entry (not shown) corresponding to the selected physical page. Therefore, the memory-bank-power-supply control module 119 proceeds to Step 804 without executing Step 803.

On the other hand, when it is judged in Step 802 that the physical page is currently used, the memory-bank-power-supply control module 119 invalidates the page table entry corresponding to the physical page selected in Step 801 (803). As a result, after that, when there is an access to the physical page, a page fault occurs.

The memory-bank-power-supply control module 119 judges whether the physical page selected in Step 801 is the last physical page in the memory bank 103 (804).

When it is judged in Step 804 that the physical page selected is not the last physical page, in order to execute necessary setting for the remaining physical pages, the processing returns to Step 801. In this case, the memory-bank-power-supply control module 119 selects a physical page next to the physical page selected in Step 801 last time (801) and executes the processing in Step 802 and the subsequent steps.

On the other hand, when it is judged in Step 804 that the physical page selected is the last physical page, the necessary setting is finished for page table entries corresponding to all the physical pages in the memory bank 103. In this case, the memory-bank-power-supply control module 119 switches setting of the power supply for the memory bank 103 to the low power consumption mode (805).

Actually, the power supply for the memory bank 103 is controlled by the memory controller 102. Therefore, in Step 805, the memory-bank-power-supply control module 119 transmits an instruction to switch the setting of the power supply for the memory bank 103 to the low power consumption mode to the memory controller 102. The memory controller 102, which receives the instruction, controls the power supply according to the instruction.

The memory-bank-power-supply control module 119 updates, in the memory bank/page management table 114, a value of the bank power supply 602 corresponding to the memory bank 103 set in the low power consumption mode to "OFF" (806).

Thus, the power supply for the memory bank 103 is set in the low power consumption mode. When a plurality of memory banks 103 are registered in the low-power-consumption candidate list, the processing shown in FIG. 8 is executed on the respective memory banks 103 registered.

Figure 9:
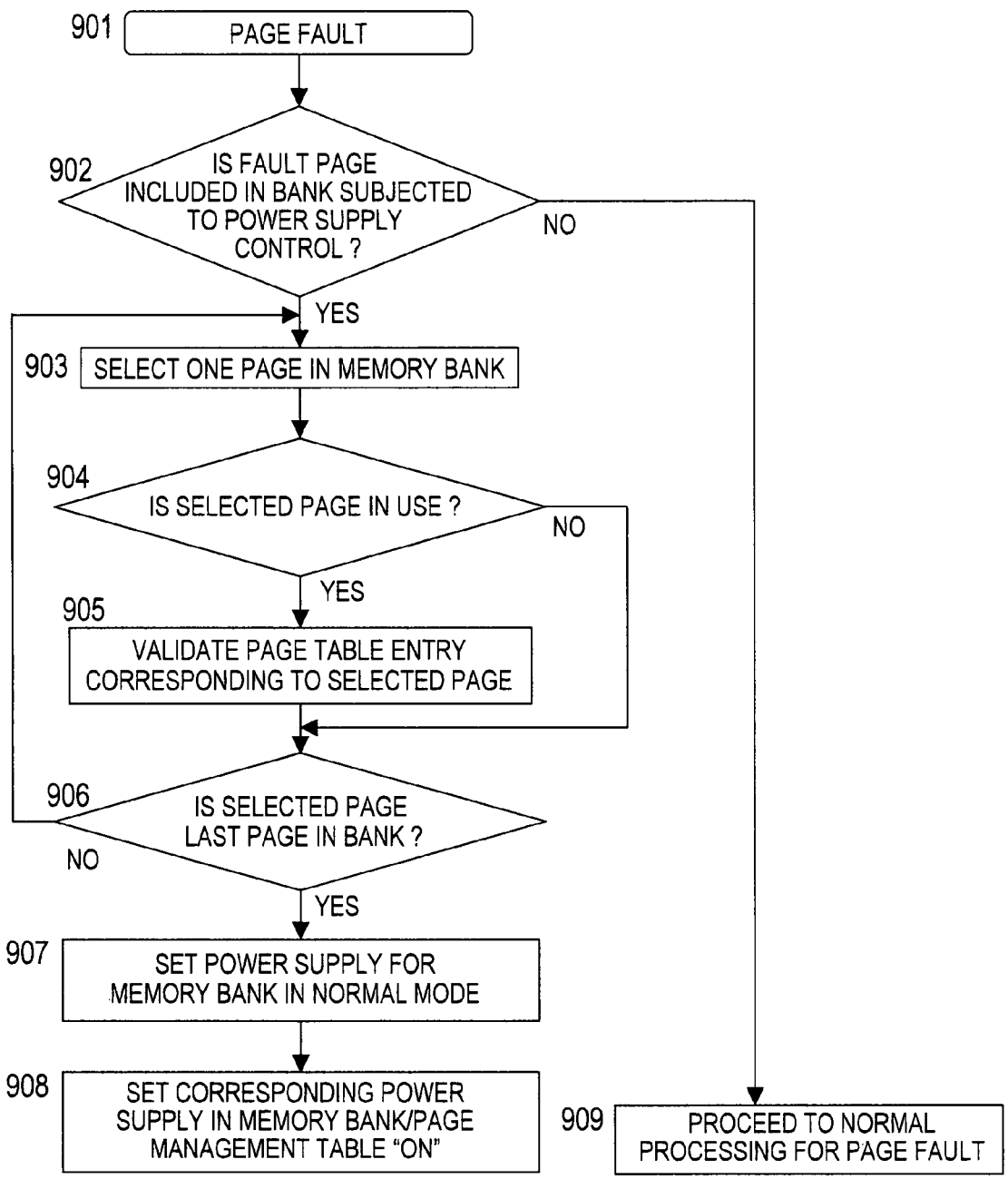
FIG. 9 is a flowchart of processing executed by the memory-bank-power-supply control module according to the first embodiment of this invention in order to set the power supply for the memory bank in the normal mode.

FIG. 9 is a flowchart of processing executed by the memory-bank-power-supply control module 119 according to the first embodiment of this invention in order to set the power supply for the memory bank 103 in the normal mode.

Specifically, the processing in FIG. 9 is executed, when a page fault occurs, in order to set the power supply for the memory bank 103 including a physical page in which the page fault has occurred in the normal mode.

When a page fault occurs in any one of the physical pages, the main-bank-power-supply control module 119 starts execution of the processing shown in FIG. 9 (901).

First, the memory-bank-power-supply control module 119 judges whether the physical page in which the page fault has occurred is included in the memory bank 103 subjected to power supply control (i.e., whether the power supply for the memory bank 103 including the physical page in which the page fault has occurred is set in the low power consumption mode) (902). This is because a page fault may occur even if the memory bank 103 is not in the low power consumption mode.

When it is judged in Step 902 that the power supply for the memory bank 103 including the physical page in which the page fault has occurred is not set in the low power consumption mode, the memory-bank-power-supply control module 119 finishes the processing shown in FIG. 9. Thereafter, normal processing (same as the conventional processing) for the page fault is executed (909).

On the other hand, when it is judged in Step 902 that the power supply for the memory bank 103 including the physical page in which the page fault has occurred is set in the low power consumption mode, the setting of the low power consumption mode is a cause of the page fault. In this case, the memory-bank-power-supply control module 119 selects one physical page (e.g., a physical page at the top) of the memory bank 103 including the physical page in which the page fault has occurred (903).

Next, the memory-bank-power-supply control module 119 judges whether the physical page selected in Step 903 is currently used (904). This judgment may be executed according to the same method as Step 503 of FIG. 5.

When it is judged in Step 904 that the selected physical page is not currently used, it is unnecessary to validate the page table entry corresponding to the selected physical page. Therefore, the memory-bank-power-supply control module 119 proceeds to Step 906 without executing Step 905.

On the other hand, when it is judged in Step 904 that the physical page is currently used, the memory-bank-power-supply control module 119 validates the page table entry corresponding to the physical page selected in Step 903 (905). As a result, after that, when there is an access to the validated physical page, the access is permitted, and a page fault due to the low power consumption mode does not occur.

The memory-bank-power-supply control module 119 judges whether the physical page selected in Step 903 is the last physical page in the memory bank 103 (906).

When it is judged in Step 906 that the physical page selected is not the last physical page, in order to execute necessary setting for the remaining physical pages, the processing returns to Step 903. In this case, the memory-bank-power-supply control module 119 selects a physical page next to the physical page selected in Step 903 last time (903) and executes the processing in Step 904 and the subsequent steps.

On the other hand, when it is judged in Step 906 that the physical page selected in the last physical page, the necessary setting is finished for page table entries corresponding to all the physical pages in the memory bank 103. In this case, the memory-bank-power-supply control module 119 switches setting of the power supply for the memory bank 103 to the normal mode (907).

Actually, the memory-bank-power-supply control module 119 transmits an instruction to switch the setting of the power supply for the memory bank 103 to the normal mode to the memory controller 102. The memory controller 102 which receives the instruction controls the power supply according to the instruction.

The memory-bank-power-supply control module 119 updates, in the memory bank/page management table 114, a value of the bank power supply 602 corresponding to the memory bank 103 set in the normal mode to "ON" (908).

Thus, the power supply for the memory bank 103 is set in the normal mode. When any one of the physical pages included in the memory bank 103 set in the low power consumption mode is an object of access, the power supply for the memory bank 103 including the physical page is switched to the normal mode.

Figure 10:
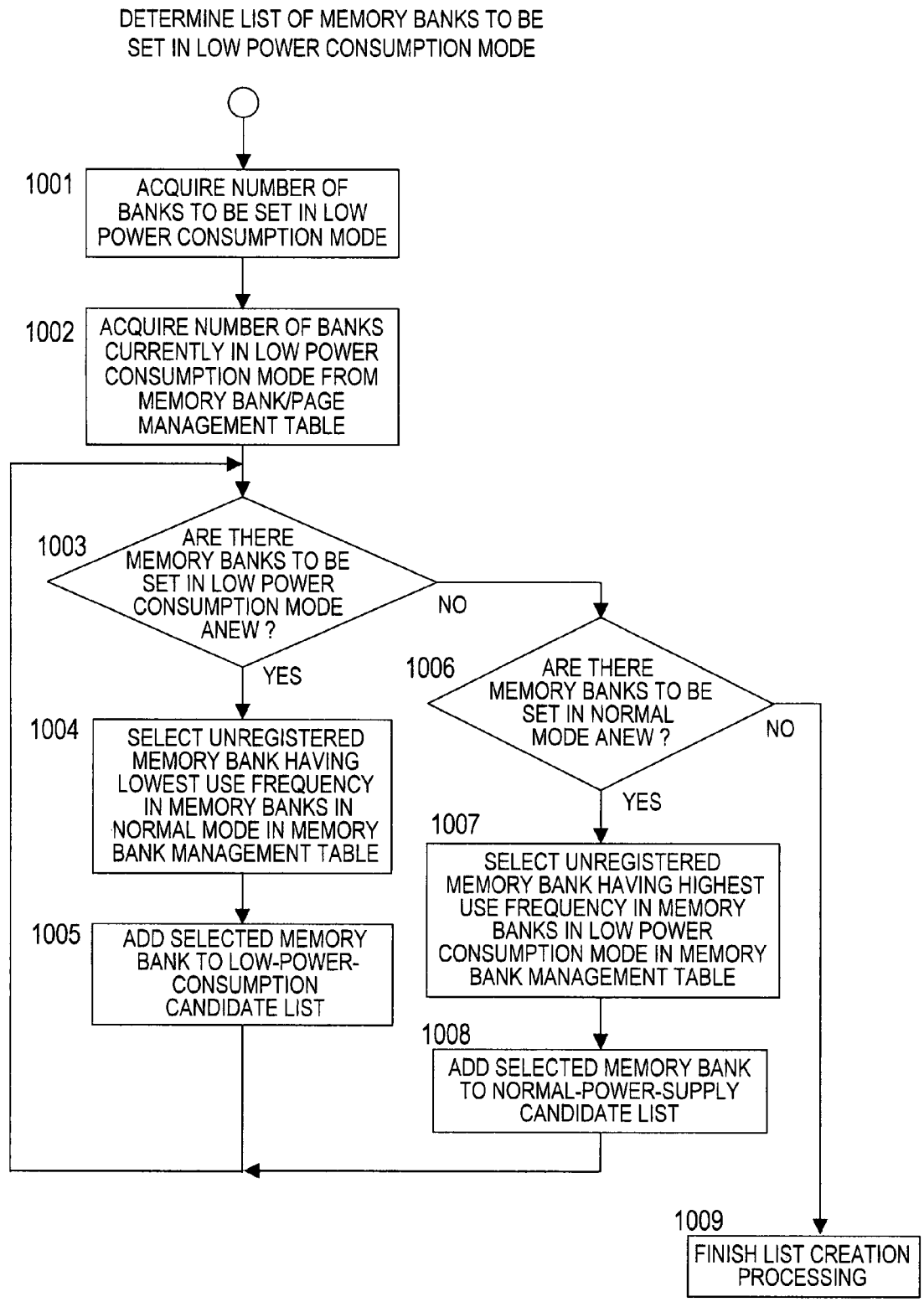
FIG. 10 is a flowchart of processing executed by the memory-bank-power-supply judging module according to the first embodiment of this invention in order to create a list of the memory banks to be subjected to power supply control.

FIG. 10 is a flowchart of processing executed by the memory-bank-power-supply judging module 118 according to the first embodiment of this invention in order to create a list of the memory banks 103 to be subjected to power supply control.

Specifically, the processing shown in FIG. 10 is executed in Step 203 in FIG. 2 in order to create a low-power-consumption candidate list and a normal-power-consumption candidate list (not shown). The memory banks 103 that should be set in the lower power consumption mode are registered in the low-power-consumption candidate list. The memory banks 103 that should be set in the normal mode are registered in the normal-power-consumption candidate list. When execution of the processing shown in FIG. 10 is started, no memory bank 103 is registered in the low-power-consumption candidate list or the normal-power-consumption candidate list.

First, the memory-bank-power-supply judging module 118 acquires the number of memory banks 103 that should be set in the low power consumption mode (1001). The number of memory banks acquired in Step 1001 may be determined according to, for example, a method described later with reference to FIG. 11.

Next, the memory-bank-power-supply judging module 118 acquires the number of the memory banks 103 currently set in the low power consumption mode with reference to the memory bank/page management table 114 (1002).

The memory-bank-power-supply judging module 118 judges whether there is the memory bank 103 that is to be set in the low power consumption mode anew (in other words, whether there is the memory bank 103 that should be registered in the low-power-consumption candidate list anew) (1003). In order to execute the judgment in Step 1003, the memory-bank-power-supply judging module 118 compares the number of the memory banks 103 acquired in Step 1001, the number of the memory banks 103 acquired in Step 1002, and the number of the memory banks 103 registered in the low-power-consumption candidate list already.

When the number of the memory banks 103 acquired in Step 1001 is larger than a sum of the number of memory banks 103 acquired in Step 1002 and the number of memory banks 103 registered in the low-power-consumption candidate list already, in Step 1003, it is judged that there is the memory bank 103 that should be registered in the low-power-consumption candidate list anew. In this case, the memory-bank-power-supply judging module 118 selects the memory bank 103 having a lowest use frequency among the memory banks 103 that are currently in the normal mode and not registered in the low-power-consumption candidate list yet with reference to the memory bank/page management table 114 (1004). The memory bank 103 having the lowest use frequency is, for example, a memory bank 103 having a largest use frequency average 603.

The memory-bank-power-supply judging module 118 additionally registers the memory bank 103 selected in Step 1004 in the low-power-consumption candidate list (1005).

Thereafter, the processing returns to Step 1003.

On the other hand, when the number of the memory banks 103 acquired in Step 1001 is equal to or smaller than a sum of the number of the memory banks 103 acquired in Step 1002 and the number of the memory banks 103 registered in the low-power-consumption candidate list already, in Step 1003, it is judged that there is no memory bank 103 that should be registered in the low-power-consumption candidate list anew.

In this case, the memory-bank-power-supply judging module 118 judges whether there is the memory bank 103 that is to be set in the normal power consumption mode anew (in other words, whether there is the memory bank 103 that should be registered in the normal-power-consumption candidate list anew) (1006). In order to execute the judgment in Step 1006, the memory-bank-power-supply judging module 118 compares the number of the memory banks 103 acquired in Step 1001, the number of the memory banks 103 acquired in Step 1002, and the number of the memory banks 103 registered in the normal-power-consumption candidate list already.

When the number of the memory banks 103 acquired in Step 1001 is smaller than a value obtained by subtracting the number of memory banks 103 registered in the normal-power-consumption candidate list already from the number of memory banks 103 acquired in Step 1002, it is judged, in Step 1006, that there is the memory bank 103 that should be registered in the normal-power-consumption candidate list anew. In this case, the memory-bank-power-supply judging module 118 selects the memory bank 103 having a highest use frequency among the memory banks 103 that are currently in the low-power-consumption mode and not registered in the normal-power-consumption candidate list yet with reference to the memory bank/page management table 114 (1007). The memory bank 103 having the highest use frequency is, for example, a memory bank 103 having a smallest use frequency average 603.

The memory-bank-power-supply judging module 118 additionally registers the memory bank 103 selected in Step 1007 in the normal-power-consumption candidate list (1008).

Thereafter, the processing returns to Step 1003.

On the other hand, when the number of the memory banks 103 acquired in Step 1001 is equal to or larger than a value obtained by subtracting the number of the memory banks 103 registered in the low-power-consumption candidate list already from the number of the memory banks 103 acquired in Step 1002, it is judged, in Step 1003, that there is no memory bank 103 that should be registered in the normal-power-consumption candidate list anew. In this case, the memory-bank-power-supply judging module 118 finishes the processing for creating the lists (1009).

As a result of finishing the processing in FIG. 10, when one or more memory banks 103 are registered in the low-power-consumption candidate list, the processing shown in FIG. 8 is executed on the respective memory banks 103. On the other hand, when one or more memory banks 103 are registered in the normal-power-consumption candidate list, the processing indicated by Steps 903 to 908 of FIG. 9 is executed on the respective memory banks 103.

FIG. 11 is a flowchart of processing executed by the memory-bank-power-supply judging module 118 according to the first embodiment of this invention in order to determine the number of the memory banks 103 that should be set in the low power consumption mode.

The processing shown in FIG. 11 is executed in order to determine the number of the memory banks 103 acquired in Step 1001 of FIG. 10.

First, the memory-bank-power-supply judging module 118 acquires a target power consumption value and a power consumption value per bank (1101).

Next, the memory-bank-power-supply judging module 118 determines the number of the memory banks 103 which should be set in the low power consumption mode on the basis of the value acquired in Step 1101 (1102).

The values acquired in Step 1101 and details of Step 1102 executed using those values will be explained with reference to FIGS. 12 and 13.

FIG. 12 is a diagram for explaining the target power consumption value referred to by the memory-bank-power-supply judging module 118 according to the first embodiment of this invention.

The target power consumption value shown in FIG. 12 is, for example, a target value of a sum of power consumption of all the memory banks 103. For example, a user of the computer shown in FIG. 1 may set the target power consumption value by means of a system call or a setting file. The target power consumption value set is stored in, for example, any one of the memory banks 103 to be held in the computer. FIG. 12 shows an example in which "10 W" is set as the target power consumption value. This value is referred to by the memory-bank-power-supply judging module 118 in Step 1101 of FIG. 11.

FIG. 13 is a diagram for explaining a power-consumption-per-bank table 1300 according to the first embodiment of this invention.

The power-consumption-per-bank table 1300 includes a power consumption 1301 per one memory bank 103 in the normal mode (hereinafter referred to as normal mode 1301) and a power consumption 1302 per one memory bank 103 in the low power consumption mode (hereinafter referred to as low power consumption mode 1302). For example, the user of the computer shown in FIG. 1 may set these values by means of a system call or a setting file. The power-consumption-per-bank table 1300 is stored in, for example, any one of the memory banks 103 to be held in the computer.

FIG. 13 shows an example in which "1300 mW" is set as the normal mode 1301 and "100 mW" is set as the low power consumption mode 1302. These values are referred to by the memory-bank-power-supply judging module 118 in Step 1101 of FIG. 11.

A method of determining the number of memory banks 103 in Step 1102 of FIG. 11 will be explained using the examples of FIGS. 12 and 13.

It is assumed for convenience of explanation that the hardware 100 shown in FIG. 1 includes ten memory banks 103. In this case, when all the ten memory banks 103 are in the normal mode, a total power consumption of all the memory banks 103 is "13 W", which is ten times as large as "1300 mW" set in the normal mode 1301. This value exceeds "10 W" set as the target power consumption value.

However, when the seven memory banks 103 are set in the normal mode and the remaining three memory banks 103 are set in the low power consumption mode, a total power consumption of all the memory banks 103 is "9400 mW", which is below "10 W" set as the target power consumption value. In other words, a minimum value of the number of memory banks 103 in the low power consumption mode necessary for setting a total power consumption of all the memory banks 103 to be smaller than the target power consumption value is "3". In this case, in Step 1102, the number of the memory banks 103 that should be set in the low power consumption mode is determined as "3".

In this way, in Step 1102, the number of the memory banks 103 in the low power consumption mode necessary for setting a total power consumption of all the memory banks 103 to be smaller than the target power consumption value is calculated. The number of the memory banks 103 determined by the processing shown in FIG. 11 is acquired in Step 1001 of FIG. 10.

The number of the memory banks 103 acquired in Step 1001 of FIG. 10 may be determined by the processing shown in FIG. 11. However, as shown in FIG. 14, the number of the memory banks 103 may be determined in advance by the user or the like.

FIG. 14 is a diagram for explaining a target value of the number of low power consumption mode banks referred to by the memory-bank-power-supply judging module 118 according to the first embodiment of this invention.

The target value of the number of low power consumption mode banks shown in FIG. 14 is a target value of the number of the memory banks 103 that should be set in the low power consumption mode among all the memory banks 103. For example, the user of the computer shown in FIG. 1 may set the target value of the number of low power consumption mode banks by means of a system call or a setting file. The set target value of the number of low power consumption mode banks is stored in, for example, any one of the memory banks 103 to be held in the computer.

FIG. 14 shows an example in which "5" is set as the target value of the number of low power consumption mode banks. The memory-bank-power-supply judging module 118 acquires, in Step 1001 of FIG. 10, a value set as the target value of the number of low power consumption mode banks.

The method shown in FIG. 10 has an advantage in that it is possible to constantly control a total power consumption of all the memory banks 103 to be equal to or smaller than a predetermined value. On the other hand, since a predetermined number of the memory banks 103 are always set in the normal mode, when there is little access to the memory banks 103, even the memory banks 103 that are rarely used are set in the normal mode to waste power. In order to solve this problem, the following processing shown in FIG. 15 may be executed instead of the processing shown in FIG. 10.

Figures 15, 16:
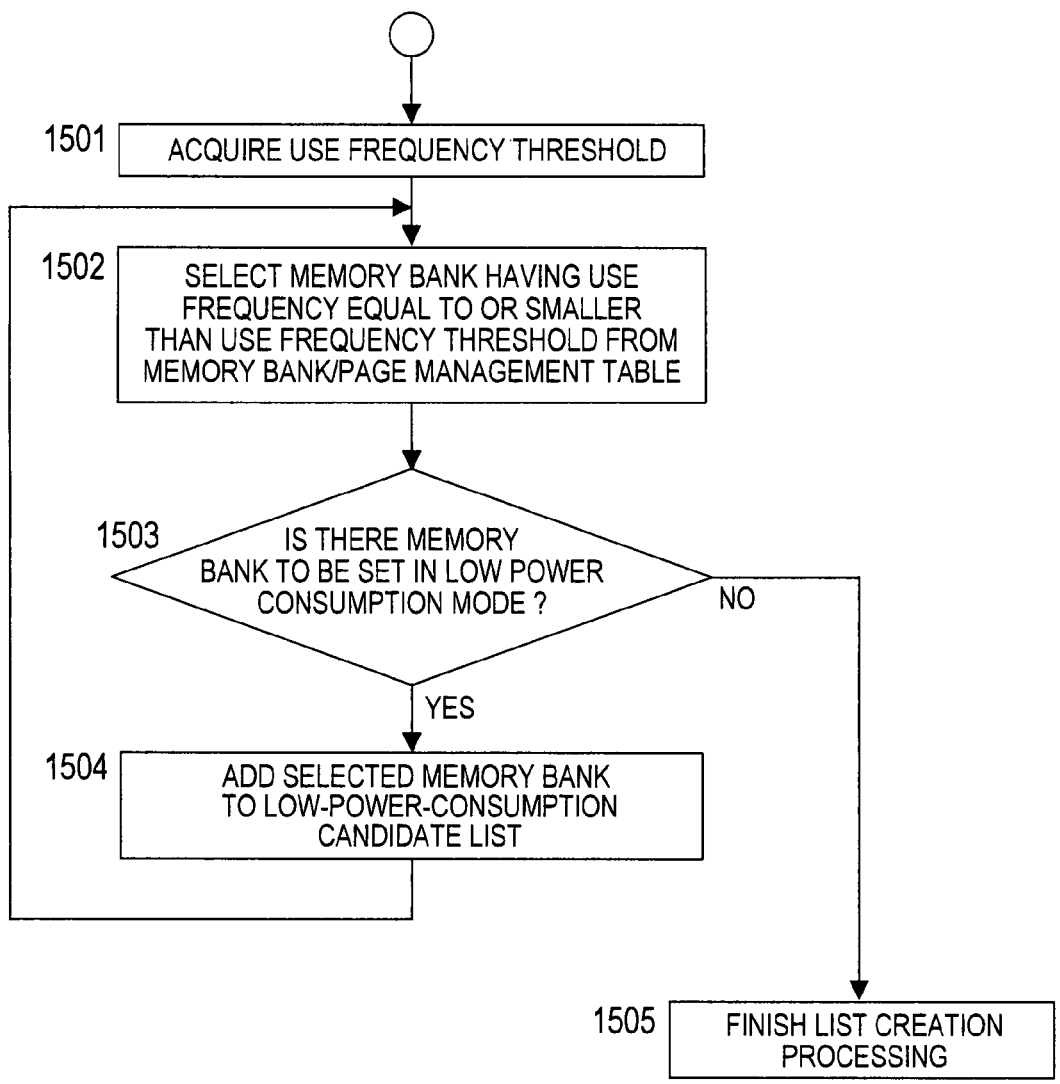
FIG. 15 is a flowchart of processing executed by the memory-bank-power-supply judging module according to the first embodiment of this invention in order to create a list of the memory banks to be subjected to power supply control on the basis of use frequencies of physical pages.
FIG. 16 is a diagram for explaining a use frequency threshold referred to by the memory-bank-power-supply judging module according to the first embodiment of this invention.

FIG. 15 is a flowchart of processing executed by the memory-bank-power-supply judging module 118 according to the first embodiment of this invention in order to create a list of the memory banks 103 to be subjected to power supply control on the basis of use frequencies of physical pages.

Specifically, the processing shown in FIG. 15 is executed in Step 203 of FIG. 2, instead of the processing shown in FIG. 10, in order to create the low-power-consumption candidate list. At the time when execution of the processing shown in FIG. 15 is started, no memory bank 103 is registered in the low-power-consumption candidate list.

First, the memory-bank-power-supply judging module 118 acquires a use frequency threshold (1501). The use frequency threshold acquired will be explained later with reference to FIG. 16. In an example of FIG. 16, "200" is acquired as the use frequency threshold.

The memory-bank-power-supply judging module 118 selects the memory bank 103 that has an actual use frequency equal to or lower than the use frequency threshold acquired in Step 1501 (1502). Specifically, the memory-bank-power-supply judging module 118 selects the memory bank 103 having the use frequency minimum value 604 equal to or larger than the use frequency threshold acquired in Step 1501 with reference to the memory bank/page management table 114 (1502). The memory bank 103 selected is the memory bank 103 that should be set in the low power consumption mode. In the example of FIG. 6, the use frequency minimum value 604 of the memory bank 103 with the bank number 601 of "2" is "300". Therefore, in this case, the memory bank 103 with the bank number 601 of "2" is selected.

The memory-bank-power-supply judging module 118 judges whether there is a memory bank 103 that should be set in the low power consumption mode (1503). Specifically, when no memory bank 103 is selected in Step 1502, the judgment results in "No" in Step 1503. Even if one or more memory banks 103 are selected in Step 1502, when the selected memory banks 103 are registered in the low-power-consumption candidate list already, the judgment results in "No" in Step 1503.

When the judgment results in "Yes" in Step 1503, the memory bank 103 that is not registered in the low-power-consumption candidate list yet is selected in Step 1502. In this case, the memory-bank-power-supply judging module 118 additionally registers the memory bank 103 selected in Step 1502 in the low-power-consumption candidate list (1504).

When the judgment results in "No" in Step 1503, all the memory banks 103 that should be set in the low power consumption mode are registered in the low-power-consumption candidate list. In this case, the memory-bank-power-supply judging module 118 finishes the processing for creating the lists shown in FIG. 15 (1505).

FIG. 16 is a diagram for explaining a use frequency threshold referred to by the memory-bank-power-supply judging module 118 according to the first embodiment of this invention.

As explained with reference to FIG. 15, when the use frequency minimum value 604 of the memory bank 103 is equal to or larger than the use frequency threshold shown in FIG. 16, the memory bank 103 is selected as the memory bank 103 that should be set in the low power consumption mode.

For example, the user of the computer shown in FIG. 1 may set the use frequency threshold shown in FIG. 16 by means of a system call or a setting file. The use frequency threshold set is stored in, for example, any one of the memory banks 103 to be held in the computer. FIG. 16 shows an example in which "200" is set as the use frequency threshold.

Figures 17, 18:
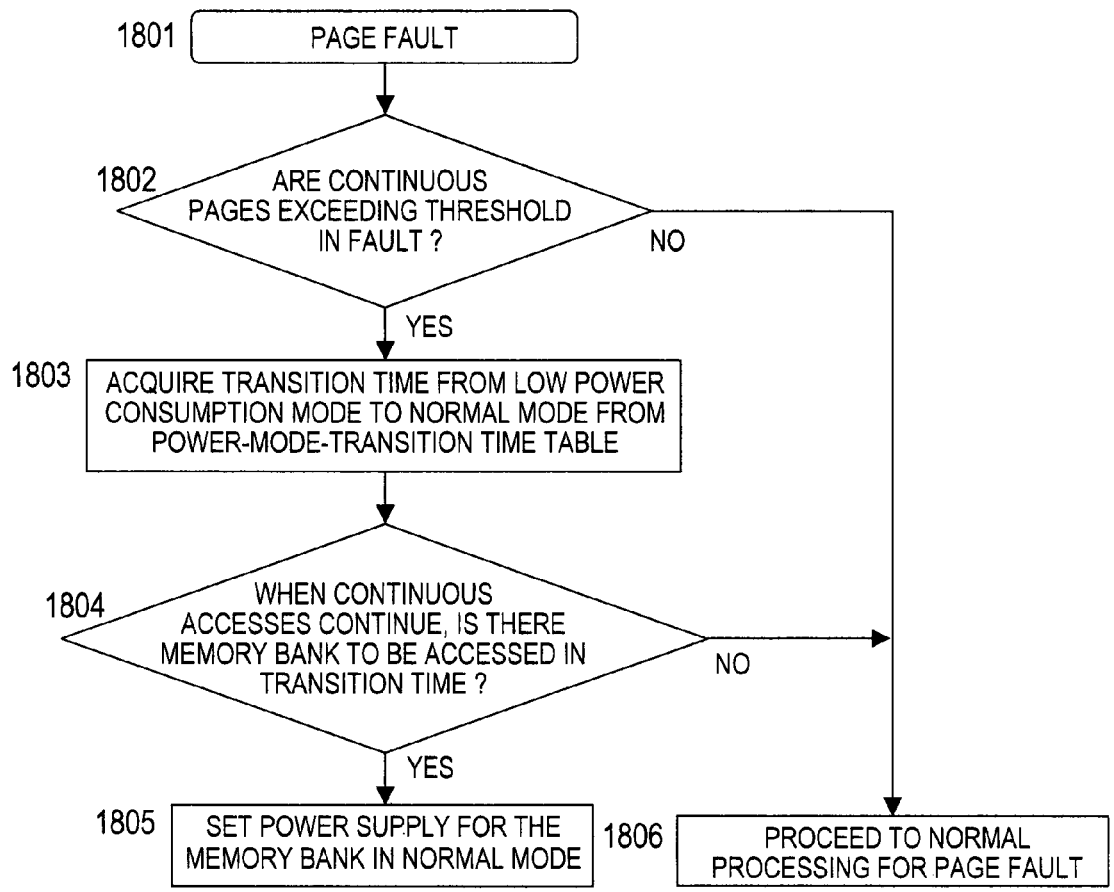
FIG. 17 is a diagram for explaining a power-mode-transition time table according to the first embodiment of this invention.
FIG. 18 is a flowchart of processing executed by the memory-bank-power-supply control module according to the first embodiment of this invention in order to set the power supply for the memory bank in the normal mode prior to an actual access.

FIG. 17 is a diagram for explaining a power-mode-transition time table 1700 according to the first embodiment of this invention.

The power-mode-transition time table 1700 includes a transition time 1701 from the normal mode to the low power consumption mode and a transition time 1702 from the low power consumption mode to the normal mode. The power-mode-transition time table 1700 is stored in, for example, any one of the memory banks 103 to be held in the computer.

In an example of FIG. 17, "5 ns (nanoseconds)" is registered as the transition time 1701 from the normal mode to the low power consumption mode and "1 μs (microseconds)" is registered as the transition time 1702 from the low power consumption mode to the normal mode. These values are referred to in processing for setting the power supply for the memory bank 103 in the normal mode prior to an actual access as shown in FIG. 18.

FIG. 18 is a flowchart of processing executed by the memory-bank-power-supply control module 119 according to the first embodiment of this invention in order to set the power supply for the memory bank 103 in the normal mode prior to an actual access.

First, a purpose of the processing shown in FIG. 18 will be explained.

As shown in FIG. 17, in order to switch the power supply for the memory bank 103 from the low power consumption mode to the normal mode, time of about 1 μs is required. When a mode of the power supply is switched after a request for access to the memory bank 103 is sent by the user program 130, processing of the user program 130 is interrupted until the switching is finished. In order to prevent deterioration in performance due to this interruption, it is desirable to predict a physical page to be accessed and set the power supply for the memory bank 103 in the normal mode in advance according to a result of the prediction.

When there are continuous accesses to continuous physical pages, it is expected that it is possible to predict a physical page to be accessed with certain accuracy by assuming that the continuous accesses will continue. The prediction in such a case and processing of control for the memory bank 103 based on the result of the prediction are shown in FIG. 18.

When a page fault occurs in any one of the physical pages, the memory-bank-power-supply control module 119 starts execution of the processing shown in FIG. 18 (1801).

The memory-bank-power-supply control module 119 judges whether a page fault has occurred in continuous physical pages of a number exceeding a predetermined threshold (1802). This threshold may be set in the memory-bank-power-supply control module 119 in advance or may be set by the user.

When it is judged in Step 1802 that a page fault has not occurred in the continuous physical pages of the number exceeding the predetermined threshold, it is impossible to predict a physical page to be accessed. In this case, the memory-bank-power-supply control module 119 executes processing for a normal page fault (1806). In this case, the memory-bank-power-supply control module 119 may execute the processing of Step 902 and the subsequent steps in FIG. 9.

On the other hand, when it is judged in Step 1802 that a page fault has occurred in the continuous physical pages of the number exceeding the predetermined threshold, the memory-bank-power-supply control module 119 acquires the transition time 1702 from the low power consumption mode to the normal mode with reference to the power-mode-transition time table 1700 (1803). In an example of FIG. 17, "1 μs" is acquired in Step 1803.

The memory-bank-power-supply control module 119 judges whether there is a memory bank 103 predicted to be accessed within time acquired in Step 1803 (1804). Specifically, the memory-bank-power-supply control module 119 assumes that, as a result of the continuation of the continuous accesses, physical pages continuing even after the continuous physical pages in which the page fault has already occurred are to be sequentially accessed. Under such an assumption, the memory-bank-power-supply control module 119 judges whether there is a memory bank 103 including a physical page to be accessed within the time acquired in Step 1803.

When it is judged in Step 1804 that there is a memory bank 103 predicted to be accessed within the time acquired in Step 1803, the memory-bank-power-supply control module 119 executes processing for setting the power supply for the memory bank 103 in the normal mode (1805). In this case, the memory-bank-power-supply control module 119 may execute the processing from Steps 903 to 908 in FIG. 9 on the memory bank 103 that is judged to be accessed in Step 1804.

On the other hand, when it is judged in Step 1804 that there is no memory bank 103 that is predicted to be accessed within the time acquired in Step 1803, it is unnecessary to set the power supply for the memory bank 103 in the normal mode in advance. In this case, the memory-bank-power-supply control module 119 executes the processing for a normal page fault (1806).

The processing shown in FIG. 18 is finished here.

According to the first embodiment of this invention described above, actual use frequencies of the respective physical pages are evaluated on the basis of the reference bit and the update bit of the page table. The physical pages with low use frequencies are collected in the same memory bank 103 and the power supply for the memory bank 103 is set in the low power consumption mode. As a result, it is possible to reduce a total power consumption of all the memory banks 103. When there are accesses to the continuous physical pages, a physical page to be accessed is predicted and the power supply for the memory bank 103 including the physical page predicted is set in the normal mode in advance. As a result, it is possible to prevent deterioration in processing performance of the computer.

A second embodiment of this invention will be explained next.

In the first embodiment of this invention shown in FIG. 1, the OS 110 executes the power supply control for the memory banks 103 as shown in FIGS. 2 to 18. On the other hand, in recent years, a technique for virtualizing resources of a computer, such as a Hypervisor or a virtual machine monitor (VMM) is developed. When such a virtualizing technique is implemented, the control shown in FIGS. 2 to 18 may be realized by the Hypervisor or the VMM.

Figure 19:
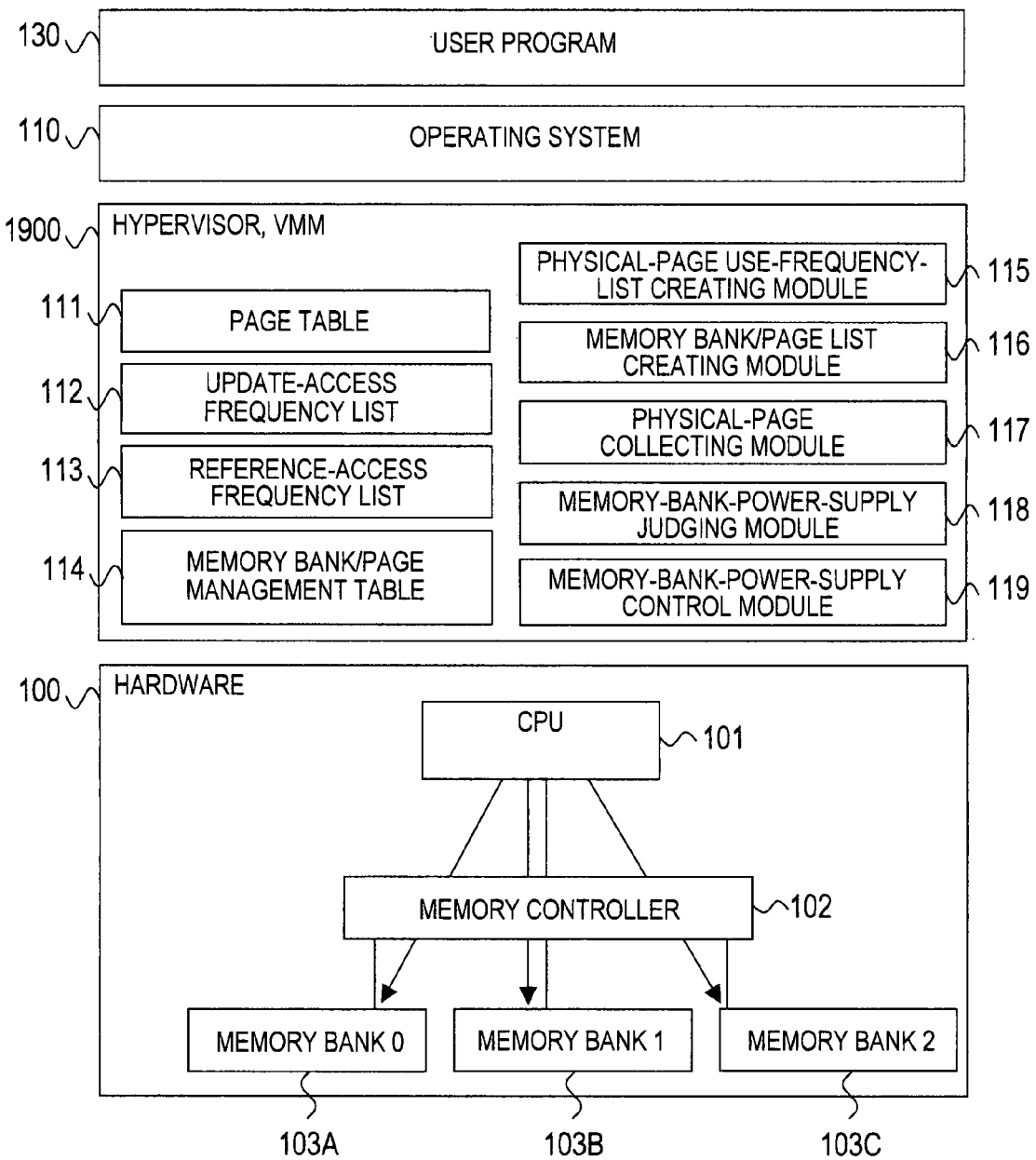
FIG. 19 is a block diagram for explaining a structure of a computer according to the second embodiment of this invention.

FIG. 19 is a block diagram for explaining a structure of a computer according to the second embodiment of this invention.

The computer according to the second embodiment includes a hardware 100, a Hypervisor or VMM 1900, an OS 110, and an user program 130.

Since the hardware 100 and the user program 130 are the same as those in the first embodiment, explanations thereof are omitted.

The Hypervisor or VMM 1900 is software for virtualizing resources of the hardware 100. This software is stored in any one of the memory banks 103. The Hypervisor or VMM 1900 according to the second embodiment includes a page table 111, an update-access frequency list 112, a reference-access frequency list 113, a memory bank/page management table 114, a physical-page use-frequency-list creating module 115, a memory bank/page list creating module 116, a physical-page collecting module 117, a memory-bank-power-supply judging module 118, and a memory-bank-power-supply control module 119. Since those modules and the like are the same as those in the first embodiment, explanations thereof are omitted, and reference should be made to FIGS. 2 to 18.

The OS 110 according to the second embodiment does not have to include the structure from the page table 111 to the memory-bank-power-supply control module 119 included in the OS 110 according to the first embodiment. Otherwise, the OS 110 according to the second embodiment may be the same as the OS 110 according to the first embodiment.

According to the second embodiment of this invention, functions same as those in the first embodiment are realized by software for virtualizing hardware. Therefore, it is possible to reduce power consumption of the computer by controlling power supplies for memories without changing the existing OS.

While the present invention has been described in detail and pictorially in the accompanying drawings, the present invention is not limited to such detail but covers various obvious modifications and equivalent arrangements, which fall within the purview of the appended claims.

What is claimed is:

1. A memory management method in a computer system having a processor and a memory for storing information referred to by the processor, the memory including a plurality of memory banks, each of the memory banks having a plurality of physical pages, each of the memory banks having a respective power supply that is independently controlled, the memory management method comprising:
creating a use frequency list indicating an order of respective use frequencies of the physical pages of the memory banks of the memory;
registering at least one of a maximum value, a minimum value, and an average value of the respective use frequencies of the physical pages for each memory bank in a memory bank management table;
selecting one of the memory banks of the plurality of memory banks as a migration destination of a first physical page of the physical pages based on the at least one of the maximum values, the minimum values, and the average values of the respective use frequencies registered for the memory banks in the memory bank management table;
determining whether there is an unused physical page in the memory bank selected as the migration destination;
upon determining that there is an unused physical page in the memory bank selected as the migration destination, moving contents of the first physical page to the unused physical page in the memory bank selected as the migration destination and updating the use frequency list and the memory bank management table to reflect moving of the contents of the first physical page to the unused physical page;
upon determining that there is not an unused physical page in the memory bank selected as the migration destination, selecting a second physical page from the memory bank selected as the migration destination, interchanging the contents of the first physical page with contents of the second physical page, and updating the use frequency list and the memory bank management table to reflect interchanging of the contents of the first physical page with the contents of the second physical page;
determining to control the respective power supply of one of the memory banks of the plurality of memory banks selected based on the at least one of the maximum values, the minimum values, and the average values of the respective use frequencies registered for the memory banks in the memory bank management table upon updating the memory bank management table; and
setting the respective power supply for the memory bank selected for having the respective power supply of which controlled in a low power consumption mode.

2. The memory management method according to claim 1, further comprising:
causing an interrupt in response to an access to a physical page included in the memory bank selected for having the respective power supply of which controlled;
setting the power supply for the memory bank selected for having the respective power supply of which controlled in a normal mode in which more power is consumed than in the low power consumption mode; and
permitting an access to the physical page included in the memory bank selected for having the respective power supply of which controlled upon setting the memory bank in the normal mode.

3. The memory management method according to claim 2, wherein the computer system includes a memory controller that controls the memory bank selected for having the respective power supply of which controlled, and wherein setting the power supply for the memory bank selected having the respective power supply of which controlled in the low power consumption mode and setting the power supply for the memory bank selected for having the respective power supply of which controlled in the normal mode are performed by controlling the memory controller.

4. The memory management method according to claim 2, further comprising:

predicting the physical page of the access in a predetermined time according to ongoing accesses to the physical pages; and setting the power supply for the memory bank selected for having the respective power supply of which controlled in the normal mode upon predicting the physical page of the access.

5. The memory management method according to claim 1, further comprising holding a target value of a number of memory banks set in the low power consumption mode, and wherein selecting the memory bank for having the respective power supply of which controlled comprises selecting, on the basis of the respective use frequencies, the target value of memory banks of the plurality of memory banks as objects for having the respective power supplies of which control led.

6. The memory management method according to claim 5, wherein the target value of the number of the memory banks is set by means of a system call that transmits a value to an operating system of the computer system.

7. The memory management method according to claim 5, further comprising holding values of respective power consumptions of each of the memory banks and a target power consumption value of the memory, and wherein holding the target value of a number of the memory banks set in the low power consumption mode further comprises calculating the target value of a number of the plurality of memory banks set in the low power consumption mode to set a power consumption of the memory to equal to or less than the target power consumption value.

8. The memory management method according to claim 7, wherein the values of the respective power consumptions of each of the memory banks is set by means of a system call that transmits a value to an operating system of the computer system, and wherein the target power consumption value of the memory is set by means of the system call.

9. The memory management method according to claim 1, further comprising holding a use frequency threshold, and wherein selecting the memory bank for having the respective power supply of which controlled further comprises selecting one of the plurality of memory banks that includes only physical pages for which the respective use frequency is equal to or less than the use frequency threshold as the memory bank selected for having the respective power supply of which controlled.

10. The memory management method according to claim 9, wherein the use frequency threshold is set by means of a system call that transmits a value to an operating system of the computer system.

11. The memory management method according to claim 1, wherein creating the use frequency list further comprises:
judging that a physical page referred to later has a higher reference frequency on the basis of a reference bit value of a page table;
judging that a physical page updated later has a higher update frequency on the basis of an update bit value of the page table; and
judging the respective use frequencies of the physical pages on the basis of at least one of the reference frequency and the update frequency.

12. The memory management method according to claim 1, wherein creating the use frequency list further comprises:
judging that the respective use frequency of each physical page not used by any process is lower than that of each physical page used by some process; and
judging that the respective use frequency of each physical page not used as a file cache is lower than that of each physical page used as a file cache.

13. A memory management method in a computer system having a processor and a memory for storing information referred to by the processor, the memory including a plurality of memory banks, each of the memory banks having a plurality of physical pages, each of the memory banks having a respective power supply that is independently controlled, the memory management method comprising:
creating an use frequency list indicating an order of respective use frequencies of the physical pages of the memory banks of the memory;
registering at least one of a maximum value, a minimum value, and an average value of the respective use frequencies of the physical pages for each memory bank in a memory bank management table;
selecting one of the memory banks of the plurality of memory banks as a migration destination of a first physical page of the physical pages based on a result of a comparison between the respective use frequency of the first physical page and the at least one of the maximum values, the minimum values, and the average values of the respective use frequencies for the memory banks registered in the memory bank management table;
determining whether there is an unused physical page in the memory bank selected as the migration destination;
upon determining that there is an unused physical page in the memory bank selected as the migration destination, moving contents of the first physical page to the unused physical page in the memory bank selected as the migration destination and updating the use frequency list and the memory bank management table to reflect moving of the contents of the first physical page to the unused physical page;
upon determining that there is not an unused physical page in the memory bank selected as the migration destination, selecting a second physical page from the memory bank selected as the migration destination, interchanging the contents of the first physical page with contents of the second physical page, and updating the use frequency list and the memory bank management table to reflect interchanging of the contents of the first physical page with the contents of the second physical page;
determining to control the respective power supply of one of the memory banks of the plurality of memory banks selected based on the at least one of the maximum values, the minimum values, and the average values of the respective use frequencies for the memory banks registered in the memory bank management table upon updating the memory bank management table; and
setting the respective power supply for the memory bank selected for having the respective power supply of which controlled in a low power consumption mode.

* * * * *